United States Patent [19]
McDonough et al.

[11] 3,935,412
[45] Jan. 27, 1976

[54] INDUCTION HEATED VAPOR SOURCE

[75] Inventors: George W. McDonough, Cupertino; Douglas S. Schatz, Santa Clara; Emmett R. Anderson, Los Gatos, all of Calif.

[73] Assignee: Applied Materials, Inc., Santa Clara, Calif.

[22] Filed: May 22, 1974

[21] Appl. No.: 472,179

[52] U.S. Cl. ............... 219/10.49; 13/27; 219/10.79
[51] Int. Cl.² .......................................... H05B 5/18
[58] Field of Search............ 219/10.49, 10.77, 10.67, 219/10.43; 13/27, 4

[56] References Cited
UNITED STATES PATENTS

| | | | |
|---|---|---|---|
| 1,748,706 | 2/1930 | Esmarch | 13/27 |
| 1,852,214 | 4/1932 | Northrup | 13/27 |
| 1,995,811 | 3/1935 | Long | 219/10.49 X |
| 2,848,566 | 8/1958 | Limpel | 219/10.49 |
| 3,551,115 | 12/1970 | Jamieson et al. | 219/10.49 X |
| 3,703,601 | 11/1972 | Babel | 219/10.49 X |
| 3,739,067 | 6/1973 | Stahr | 219/10.49 |

FOREIGN PATENTS OR APPLICATIONS

| | | | |
|---|---|---|---|
| 191,578 | 9/1964 | Sweden | 219/10.43 |

*Primary Examiner*—Bruce A. Reynolds
*Attorney, Agent, or Firm*—Flehr, Hohback, Test, Albritton & Herbert

[57] ABSTRACT

Induction heated vapor source particularly suitable for vacuum deposition of thin films utililzing a flat wound work coil fabricated of a solid conductor enclosed in a hermetically sealed chamber. A cooling medium is circulated through the chamber about the coil, and the coolant is passed to and from the chamber through fittings which also serve to carry electric power to the coil. A crucible for holding the material to be vaporized is mounted on an adjustable pedestal outside the sealed chamber in the field produced by the coil.

8 Claims, 5 Drawing Figures

INDUCTION HEATED VAPOR SOURCE

BACKGROUND OF THE INVENTION

This invention pertains generally to apparatus for coating materials with a vapor and more particularly to an induction heated source for vaporizing metals and other materials to be deposited in a vacuum.

Induction heated vapor sources heretofore provided for use in vacuum deposition of thin films commonly have utilized heating coils fabricated of a hollow conductor through which a coolant is circulated. The coil is energized with a radio frequency current to produce a magnetic field which induces a secondary current in the load or succeptor thus supplying heat to the material, and the amount of heat produced is dependent upon both the amount of current and the number of turns in the coil as well as the frequency of the current, nature of the material and the relative geometry of the coil and load.

With heating coils fabricated of hollow conductors, the number of turns that can be used in a given space is generally limited, and consequently a relatively high current is required to produce a given amount of heat. The higher current requires larger connecting cables and fittings, and with large currents the connecting cables are frequently water cooled hollow conductors which are difficult to install and work with.

SUMMARY AND OBJECTS OF THE INVENTION

The vapor source of the invention utilizes a flat wound work coil fabricated of a solid conductor enclosed in a hermetically sealed chamber. A cooling medium is circulated through the chamber in contact with the outside surface of the coil, and the coolant is passed to and from the chamber through fittings which also serve to carry electric power to the coil. A crucible for holding the material to be vaporized is mounted within the field of the coil on an adjustable pedestal outside the sealed chamber.

It is in general an object of the invention to provide a new and improved vapor source suitable for use in the deposition of thin films in a vacuum chamber.

Another object of the invention is to provide a new and improved vapor source of the above character in which a given amount of heat is produced with a minimum of current in a work coil of given size.

Another object of the invention is to provide a vapor source of the above character utilizing a flat wound work coil of a solid conductor.

Another object of the invention is to provide a vapor source of the above character in which the heating coil is enclosed in a hermetically sealed chamber through which a cooling medium is circulated.

Additional objects and features of the invention will be apparent from the following description in which the preferred embodiment is set forth in detail in conjunction with the accompanying drawings.

DESCRIPTION OF THE PREFERRED EMBODIMENT

Figure 1:
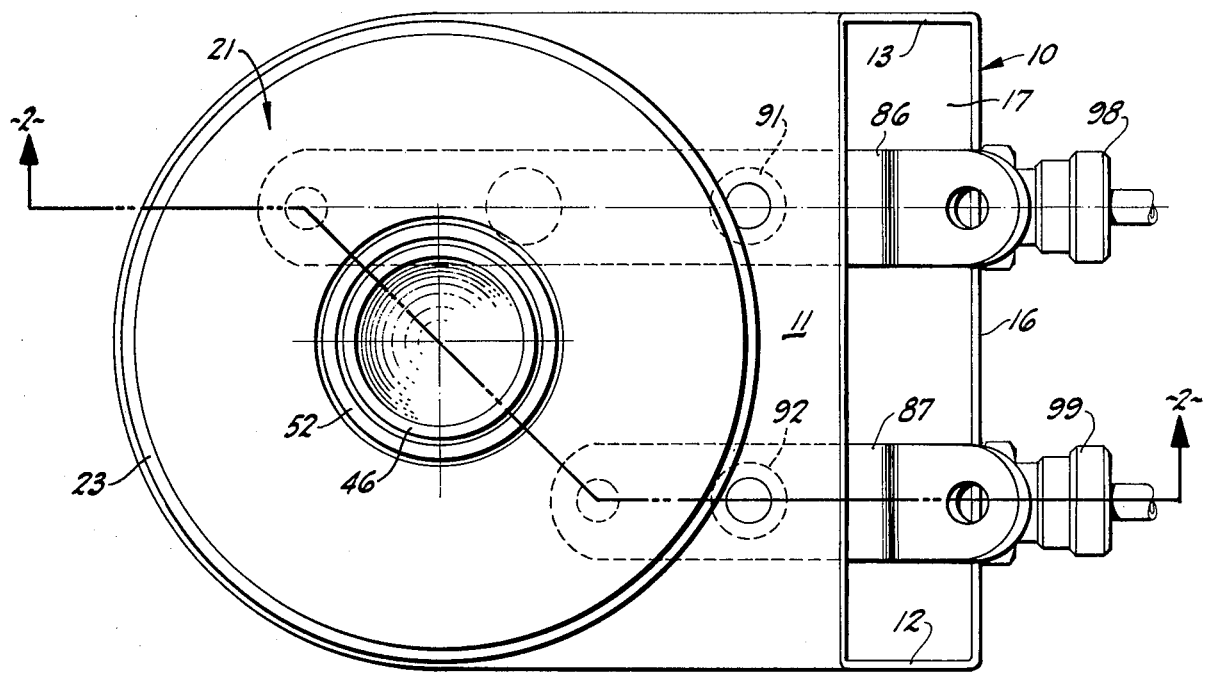
FIG. 1 is a top plan view of one embodiment of a vapor source according to the invention.
Figure 2:
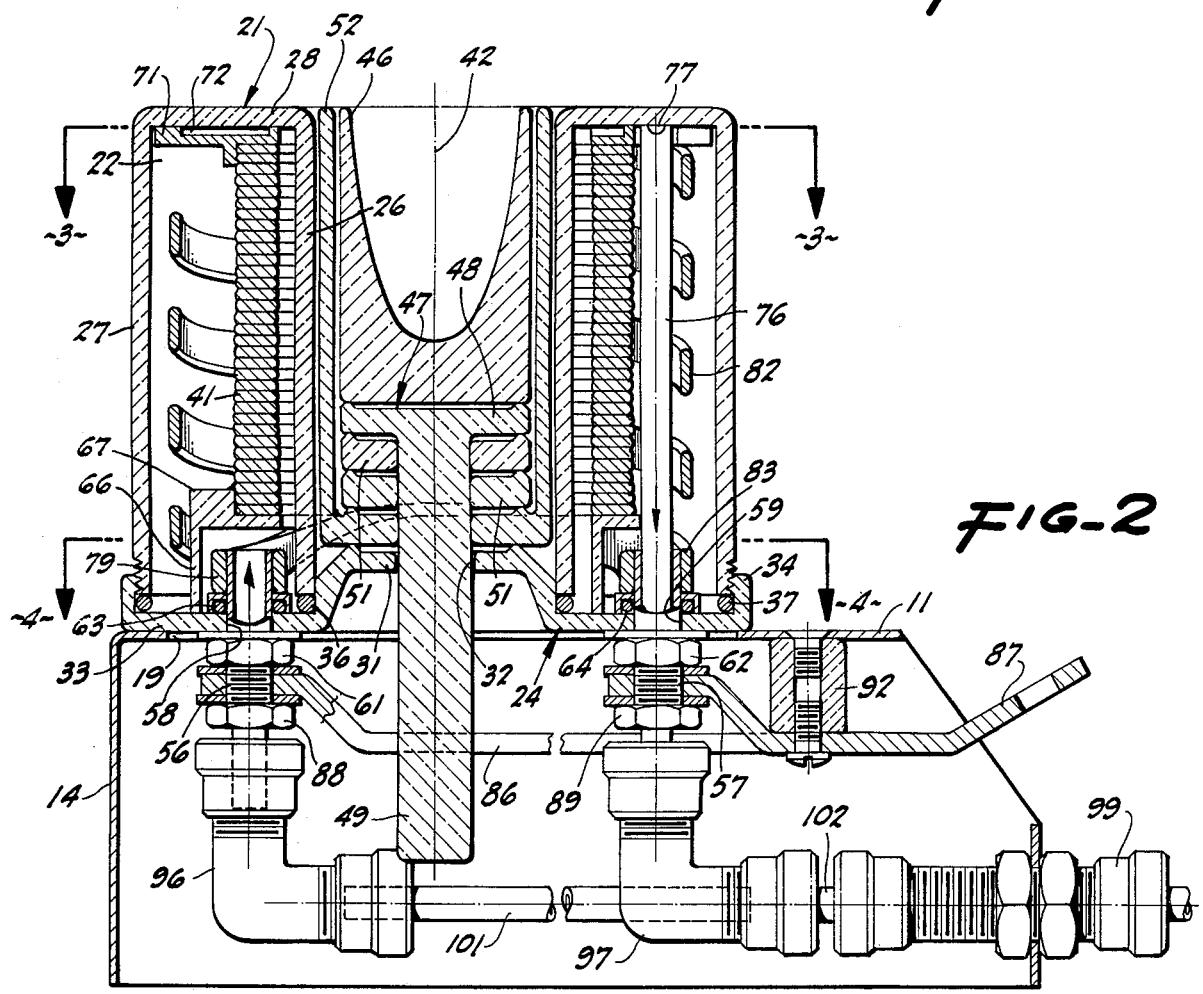
FIG. 2 is a cross sectional view taken along line 2—2 of FIG. 1.
Figure 3:
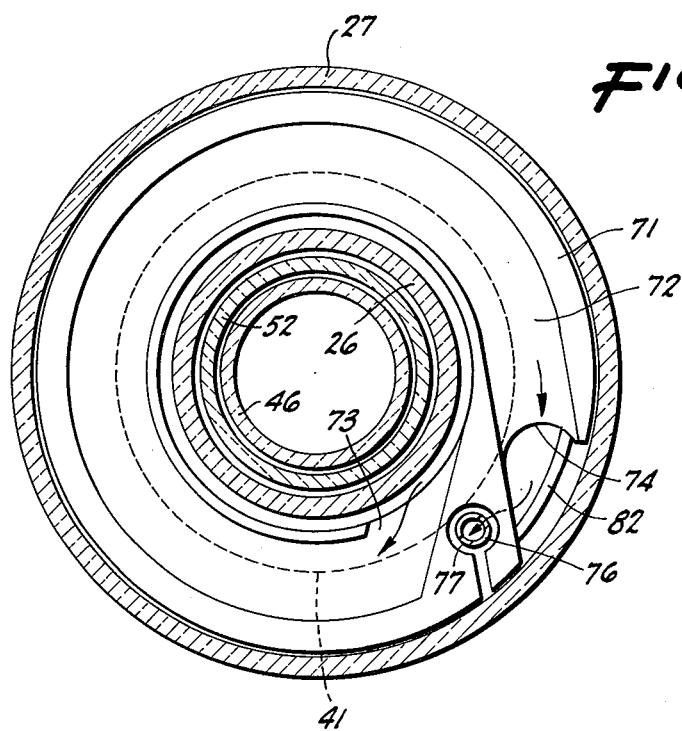
FIG. 3 is a sectional view taken along line 3—3 of FIG. 2.
Figure 4:
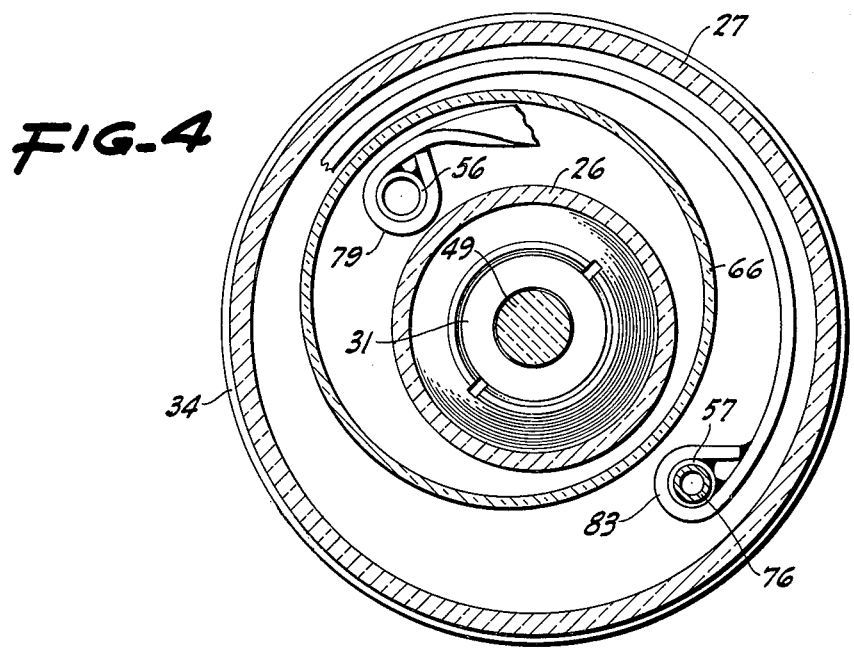
FIG. 4 is a sectional view taken along line 4—4 of FIG. 2.
Figure 5:
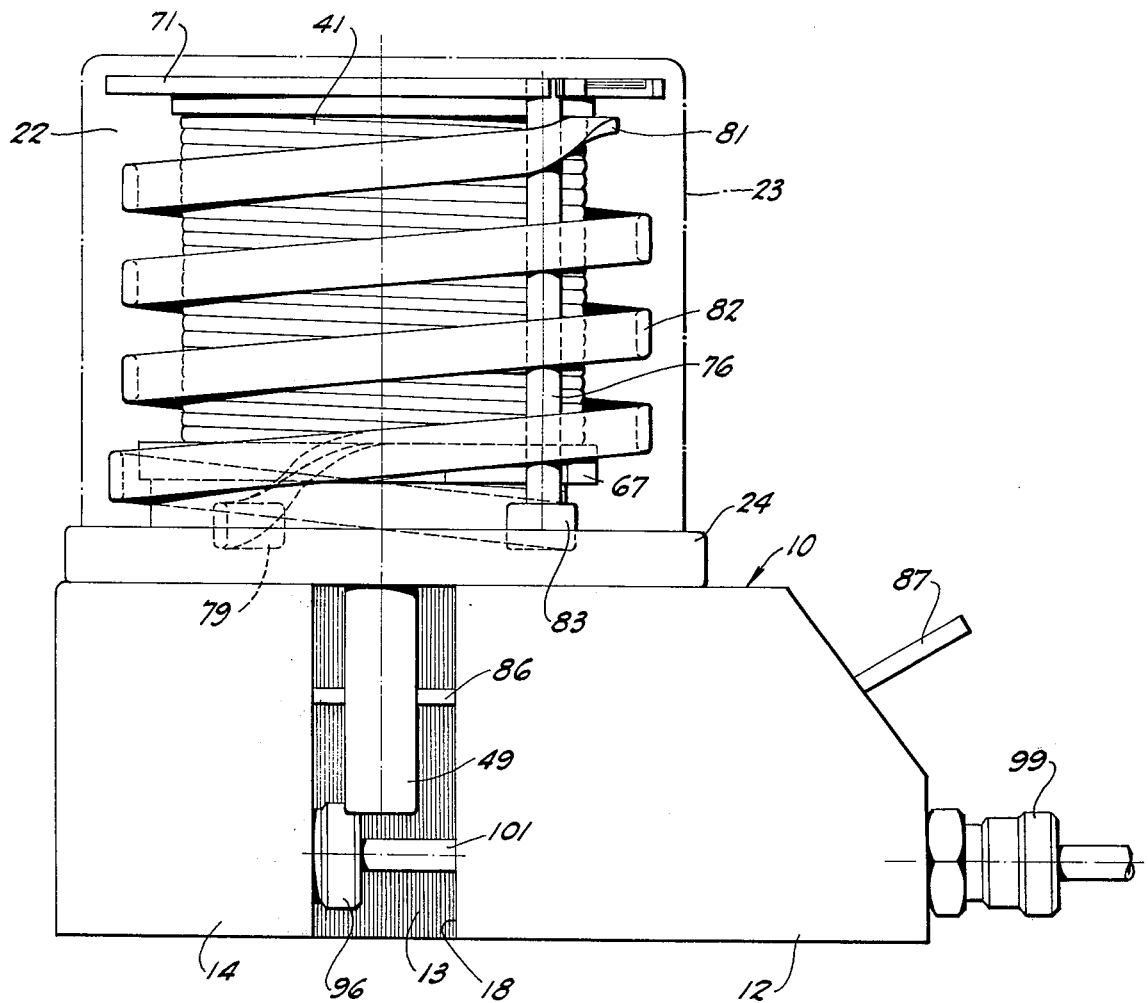
FIG. 5 is an elevational view of the vapor source of FIG. 1 with the coil housing removed.

The vapor source includes a base 10 which, in the embodiment illustrated, is fabricated of a suitable material such as sheet metal and formed to include a generally planar top wall 11, depending side walls 12 and 13, and a depending curved rear wall 14. A front wall 16 extends between the lower portion of the side walls at the front of the base, and an opening 17 is formed between the top, side and front walls. An additional opening 18 is formed in the side of the base between side wall 12 and rear wall 14, and a portion of top wall 11 is cut away, as indicated at 19.

Surmounted on base 10 is a housing assembly 21 in which a hermetically sealed chamber 22 is formed. The housing assembly is fabricated of a high temperature RF insulative material such as alumina or other suitable ceramic, and it includes a cover 23 and a base 24. The cover includes an inner side wall 26, an outer side wall 27, and annular top wall 28. Side walls 26 and 27 are generally cylindrical, and they are disposed coaxially of each other. Housing base 24 includes a raised central portion 31, in which an axial opening 32 is formed, and an annular outer portion 33 which serves as a bottom wall for chamber 22. Base 24 also includes an internally threaded cylindrical lip 34 in which the outer wall of the housing cover is threadedly received. O-rings 36 and 37 extend about the inner and outer edges of base portion 33 to form hermetic seals with side walls 26 and 27 when cover 23 is tightened in base 24.

A flat wound work coil 41 is mounted in the sealed chamber 22 within housing 21. This coil is fabricated of a generally flat, solid strip conductor, such as copper ribbon having a thickness of 0.085 inch and a width of 0.285 inch. The conductor is covered by a suitable insulative material such as a fiberglass wrapped formvar coating. The coil comprises a plurality of closely spaced windings wound about a vertical axis 42, with the flat surfaces of the conductor facing axially of the coil.

Means is provided for holding a material to be vaporized at a predetermined position with the work coil. This means includes a crucible 46 which rests on a pedestal 47 having a platform 48 and an axially extending stem 49. This stem extends through opening 32 into the region bounded by base 10 where it is accessible through opening 18. Annular spacers 51 are disposed coaxially of stem 49 between platform 48 and the raised portion 31 of housing base 24 to support the crucible and pedestal in a desired axial position. The number and size of the spacers are chosen to position the crucible as desired.

In the preferred embodiment, crucible 46 is fabricated of a dielectric material so that the energy from coil 41 will heat the material to be vaporized rather than the crucible. However, if desired, the crucible can be fabricated of any suitable material, including carbon, vitreous carbon and other electrically conductive materials. Pedestal 47 and spacers 51 are fabricated of a high temperature insulative material such as alumina or another suitable ceramic.

A cup-shaped heat shield 52 having an axial opening 53 is disposed coaxially of crucible 46 between the crucible and the inner wall 26 of housing 21. The heat shield is preferably fabricated of a low density ceramic material such as a refractory metal oxide, and it serves to reflect heat radiated by the material in the crucible back to the crucible. In addition, it provides means for containing the molten metal in the event that the crucible should fail.

Means is provided for circulating a cooling medium such as water through chamber 22 to cool coil 41 and housing 21. This means includes fluid inlet and outlet feedthrough fittings 56, 57 which extend through openings 58, 59 in the bottom wall 33 of the housing. These fittings are secured to the housing base by nuts 61, 62 and sealed by O-rings 63, 64. As will appear more fully hereinafter, inlet fitting 56 communicates with the region of the chamber between coil 41 and inner housing wall 26, and outlet fitting 57 communicates with the region between coil and outer housing wall 27 so that the coolant circulates fully about the coil.

Means is provided for directing the circulation of coolant within the chamber. This means includes a cylindrical baffle 66 which is disposed eccentrically of inner housing wall 26, with inlet fitting 56 disposed within the baffle and outlet fitting 57 outside the baffle. The lower edge of baffle 66 engages the upper surface of bottom wall 33 and forms a generally fluid tight seal therewith. A generally annular baffle 67 is mounted on top of baffle 66 and engages the lower portion of coil 41. Baffle 67 is sealed to both baffle 66 and and coil 41, and the inner diameter of baffle 67 is made larger than the diameter of wall 26 to form an annular passageway 68 between the baffle and this wall. An upper annular baffle 71 is mounted on the top of coil 41 and positioned to abut against the lower surface of top wall 28 when housing cover 21 is tightened into housing base 24. Baffle 71 is formed to include a spirally extending groove 72 which cooperates with top wall 28 to form a flow passageway when the housing is assembled. The passageway formed by groove 72 communicates with the regions inside and outside coil 41 through openings 73 and 74 at the inner and outer ends of the groove. Baffles 66, 67 and 71 are fabricated of suitable insulative materials such as polypropolene and fiberglass.

A drain tube 76 fabricated of an electrically insulative material is connected to outlet fitting 57 and extends through chamber 22 outside coil 41. The top of the drain tube abuts against the lower surface of top wall 28, and a drain opening 77 is formed in the upper portion of the tube.

Feedthrough fittings 56 and 57 are fabricated of an electrically conductive material, and the electrical connections to work coil 41 are made through these fittings. At the lower end of the coil, the conductor which forms the coil passes through an opening in baffle 67 and is formed into a loop 79 which is affixed to the upper portion of fitting 56. The conductor at the top end of the coil is twisted 90° and brought back to the bottom of the coil in the form of an edge wound helical winding outside the main portion of the coil. At the bottom of the coil, the conductor from the top is formed into a loop 83 which is affixed to fitting 57. The helical return lead has been found to be effective in eliminating non-uniformities in the field which might be present with a straight return lead.

Electrically conductive terminals 86, 87 are connected to fittings 56, 57 in base 10 and secured thereto by nuts 88, 89. These terminals are supported in spaced relation from the top wall 11 of the base by stand-off insulators 91, 92, and the free ends of the terminals extend through opening 17 for connection to a source of RF energy.

Fluid connections to fittings 56, 57 are also provided in base 10. In this regard, elbow fittings 96, 97 are connected to the feedthrough fittings, and feedthrough connectors 98, 99 are mounted in the front wall 16 of the base for connection to external flow lines. A tube 101 fabricated of an electrically insulative material such as quartz or pyrex extends between fittings 86 and 96, and a short electrically conductive tube 102 extends between fittings 87 and 97.

Operation and use of the vapor source can be described briefly. It is assumed that terminals 86, 87 are connected to a suitable source of RF energy for energizing the work coil and that connectors 98, 99 are connected to coolant inlet and return lines, respectively. The material to be vaporized is placed in crucible 46 where it is heated and vaporized by the field produced by the energized coil. When the source is deenergized and cooled, the crucible can be removed by reaching through opening 18 in the base and lifting pedestal 47 by its stem.

The coolant from inlet connector 98 flows through feedthrough fitting 56 and annular passageway 68 into the region of chamber 22 between coil 41 and inner housing wall 26. At the top of this region, the fluid passes through opening 73 into the spiral passageway formed by groove 72, and from this passageway it flows through opening 74 to the region between coil 41 and outer housing wall 27. The spiral passageway imparts a circular flow to the coolant on both sides of the coil. The swirling coolant fills the region outside the coil and exits from the top of the region through drain opening 77 in tube 76. From this tube, the coolant passes through inlet fitting 57 and outlet connector 99 to the coolant return line.

The invention has a number of important features and advantages. The flat wound work coil has about three times as many turns as a conventional heating coil of the same size fabricated of a hollow conductor, and the flat wound coil requires only about one-third as much current as a conventional coil for a given heat output. The smaller current requirement permits the use of smaller connecting cables and fittings which are relatively economical and easy to use. The coil is enclosed in a hermetically sealed housing, and the source is particularly suitable for use in a high vacuum chamber.

It is apparent from the foregoing that a new and improved vapor source has been provided. While only the presently preferred embodiment has been described, as will be apparent to those familiar with the art, certain changes and modifications can be made without departing from the scope of the invention as defined by the following claims.

We claim:
1. In an induction heated source for vaporizing a material:
   A. a base;
   B. a helically wound work coil surmounted on the base and comprising a plurality of closely spaced windings of a generally flat, solid electrical conductor oriented with its flat surfaces facing axially of the coil;
   C. a housing having radially spaced apart inner and outer side walls disposed coaxially of the coil, said housing and coil forming an inner chamber between the inner periphery of the coil and the inner wall of the housing and an outer chamber between the outer periphery and the outer wall of the housing;

D. means for supporting the material to be vaporized in a predetermined position in the region defined by the inner wall of the housing;

E. a flow inlet communicating with the inner chamber and adapted for connection to a source of liquid coolant;

F. means forming a spirally extending flow passageway between the inner and outer chambers at one end of the coil for carrying the coolant from the inner chamber to the outer chamber and imparting a swirling movement to the coolant; and G. a flow outlet communicating with the outer chamber for passing the coolant from the chamber.

2. The source of claim 1 wherein the means for supporting the material to be vaporized includes A. a crucible for holding the material;

B. an axially movable pedestal having a platform on which the crucible rests and an axial stem depending from the platform;

C. a spacer disposed coaxially of the stem between the base and the platform for supporting the crucible and pedestal in a predetermined position.

3. The source of claim 2 wherein the stem extends into the region of the base and the base has a cut-away portion permitting access to the lower portion of the stem for raising the pedestal and crucible from the predetermined axial position.

4. The source of claim 2 further including a heat shield disposed between the crucible and the inner wall of the housing.

5. The source of claim 1 wherein the flow inlet and outlet include electrically conductive members through which electrical connections are made to the coil.

6. The source of claim 1 wherein first and second electrical connectors extend through the lower wall of the housing, the lower end of the coil is connected to the first connector, and a conductor extends helically in the outer chamber from the upper end of the coil to the second connector.

7. In an induction heated source for vaporizing a material:

A. a base;

B. a housing mounted on the base having generally cylindrical inner and outer side walls disposed coaxially of a generally vertical axis and annular top and bottom walls extending between the side walls to form a hermetically sealed chamber;

C. an electrically energizable work coil wound about the generally vertical axis and disposed between the side walls of the housing, said coil comprising a plurality of closely spaced windings of a generally flat, solid conductor oriented with the flat surfaces of the conductor facing axially;

D. a crucible disposed coaxially of the coil and within the inner wall of the housing for holding the material to be vaporized;

E. an axially movable pedestal supporting the crucible;

F. means for holding the platform and crucible in a predetermined axial position;

G. fluid inlet and outlet means communicating with the chamber for circulating a cooling medium about the coil, said fluid inlet means communicating with the chamber in a first region between the coil and one of the side walls of the housing and said fluid outlet means communicating with the chamber in a second region between the coil and the other side wall; and H. means forming a spirally extending flow passageway at one end of the coil for carrying the cooling medium between the first and second regions.

8. The source of claim 7 further including a heat shield disposed between the crucible and the inner wall of the housing.

* * * * *